United States Patent [19]

Seino et al.

[11] Patent Number: 4,785,533
[45] Date of Patent: Nov. 22, 1988

[54] HYBRID INTEGRATED CIRCUIT DEVICE, AND METHOD OF AND LEAD FRAME FOR USE IN MANUFACTURING SAME

[75] Inventors: Mituaki Seino; Tsuneo Endoh, both of Komoro, Japan

[73] Assignees: Hitachi, Ltd.; Hitachi Tobu Semiconductor, Ltd., both of Tokyo, Japan

[21] Appl. No.: 15,327

[22] Filed: Feb. 17, 1987

[30] Foreign Application Priority Data

Feb. 21, 1986 [JP] Japan .................................. 61-35172
Feb. 21, 1986 [JP] Japan .................................. 61-35173

[51] Int. Cl.[4] .................... H01R 43/00; H05K 1/11
[52] U.S. Cl. ........................... 29/827; 179/52 FP; 357/74; 361/412
[58] Field of Search ................. 174/52 FP; 357/74; 361/412; 29/827; 228/180.2; 269/903

[56] References Cited

U.S. PATENT DOCUMENTS

| 3,689,684 | 9/1972 | Cox, Jr. et al. ................. 174/68.5 |
| 4,054,238 | 10/1977 | Lloyd et al. ................. 29/827 R |
| 4,169,642 | 10/1979 | Mouissie ................. 361/398 X |
| 4,214,120 | 7/1980 | Jones, Jr. et al. ................. 174/52 FP |
| 4,311,267 | 1/1982 | Lim ................. 29/840 X |
| 4,682,207 | 7/1987 | Akasaki et al. ................. 174/52 FP X |

FOREIGN PATENT DOCUMENTS 57-196554 12/1982 Japan .................................. 29/827
59-16358 1/1984 Japan .................................. 29/827

OTHER PUBLICATIONS

IBM Tech. Disclosure Bull., vol. 16, No. 4, Sep. 1973, p. 1155 by Liu.

Primary Examiner—Howard N. Goldberg
Assistant Examiner—Carl J. Arbes
Attorney, Agent, or Firm—Antonell, Terry & Wands

[57] ABSTRACT

The present invention resides in a hybrid integrated circuit device comprising; a plurality of electronic parts; a wiring board mounting the plurality of electronic parts on the primary front surface thereof; and a plurality of leads secured to the edge of the wiring board, the device being featured in that a fixing section of each of the leads consists of a main fixing portion secured to the primary rear surface of the wiring board, and an auxiliary fixing portion secured to the side face of the wiring board, the auxiliary fixing portion of the lead being branched from the main fixing portion thereof such that the branched auxiliary fixing portion is bent at an angle of approximately 90° with respect to the main fixing portion. This provides the hybrid integrated circuit device in which the leads have the enhanced connection strength against the wiring board, and the wiring board has a lower mounted height.

22 Claims, 5 Drawing Sheets

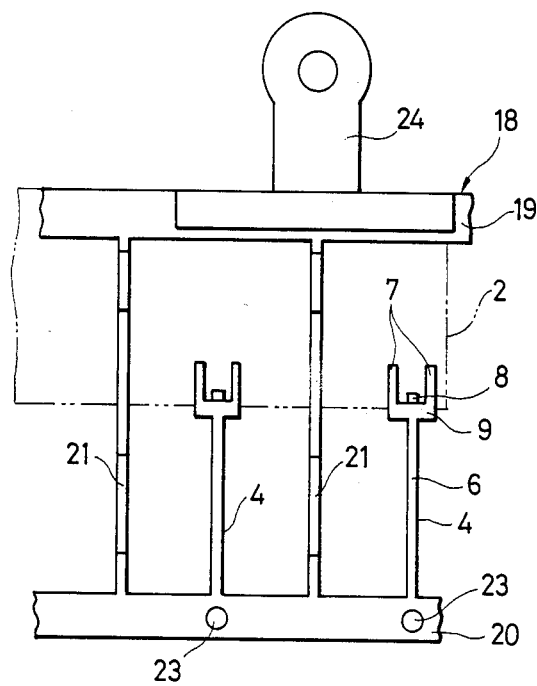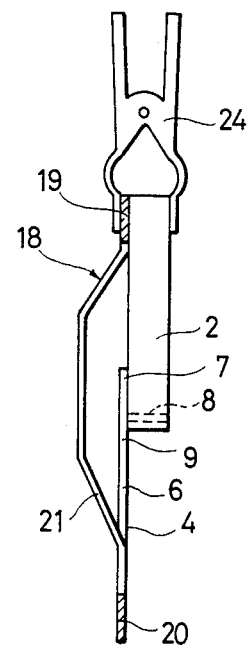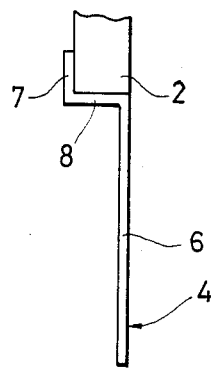

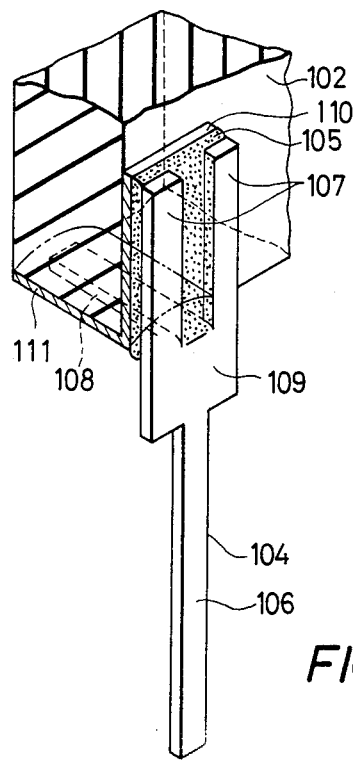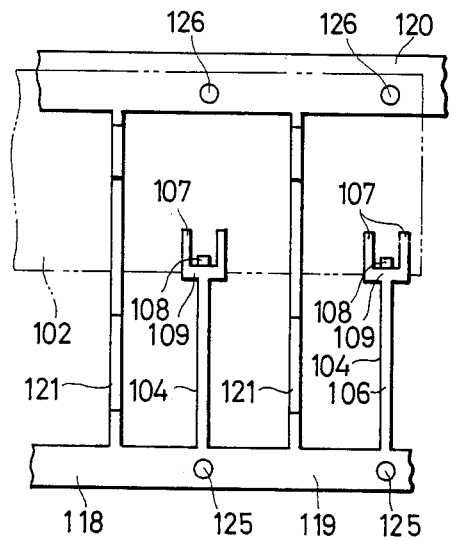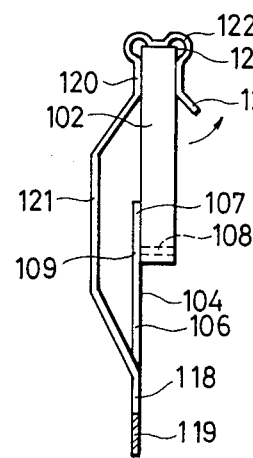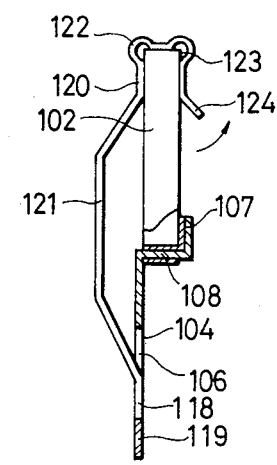

HYBRID INTEGRATED CIRCUIT DEVICE, AND METHOD OF AND LEAD FRAME FOR USE IN MANUFACTURING SAME

BACKGROUND OF THE INVENTION

The present invention relates to a hybrid integrated circuit device and a lead frame for use in manufacturing the device.

Leads fixed to a wiring board in a hybrid integrated circuit device are described in "Electronic Material" by Kogyo Chosakai (Industrial Research Association), advertisement page 273, December 1985, issued on Jan. 1, 1985. There are depicted on that page a lead of type which is adapted to clamp the edge of a wiring board, as well as a lead of type which extends linearly and has a fixing portion directly secured to the flat surface of a wiring board.

SUMMARY OF THE INVENTION

In electronic equipment such as including computers, many electronic parts are generally inserted through and mounted onto a mother board within the equipment. When a plurality of mother boards are arranged in the multistaged form, the reduced height of the electronic parts inserted through and mounted onto each mother board leads to reduction in spacing between the adjacent mother and in the size of the electronic equipment. For a hybrid integrated circuit device of type wherein leads are fixed to the edge of a wiring board which has thereon electronic parts, mounted thereon the leads are fixed to the rear surface of the wiring board, i.e., the surface of the wiring board on which no electronic parts will be mounted, so that the surface of the wiring board is effectively utilized to make smaller the width of the wiring board, i.e., the height of same when it is installed to the mother board. Because of such a single-surface fixing structure, there have been employed those leads which are extending linearly, as also depicted in the reference quoted above.

It has been observed by the present inventors that a hybrid integrated circuit device having leads of such a single-surface fixing structure cannot exhibit sufficiently large connection strength and hence a problem in of reliability arises when used under adverse environmental conditions. The inadequate connection strength arises because the leads are fixed only to a single surface of the wiring board.

It is an object of the present invention to provide a hybrid integrated circuit device in which leads have an increased connection strength against a wiring board and the wiring board has a lower mounted height.

Another object of the present invention is to provide a method of manufacturing a hybrid integrated circuit device which is able to enhance the connection strength of leads against a wiring board, and by which highly reliable hybrid integrated circuit devices can be manufactured with high efficiency and high yield.

A further object of the present invention to provide a lead frame which is able to enhance the connection strength of leads against a wiring board.

Still another object of the present invention is to provide a lead frame by which leads can be connected to a wiring board with high efficiency and high yield.

Typical ones of the inventions to be disclosed in this application will briefly summarized below.

Leads of the present invention each have, as portions to be secured to a wiring board, a main fixing portion opposite to a flat surface of the wiring board and an auxiliary fixing portion opposite to a side face of the wiring board, the main and auxiliary fixing portions being both secured to the wiring board by soldering. The auxiliary fixing portion is centrally positioned at the bottom of a recess formed in the side face of the wiring board.

In accordance with the above expedient, since the lead is secured to the wiring board at two locations, i.e., at both the main fixing portion and the auxiliary fixing portion, the connection area of the lead against the wiring board is increased to achieve enhancement of the connection strength of leads in the hybrid integrated circuit device. Also, since the auxiliary fixing portion of each lead is centrally positioned at the bottom of the recess formed in the side face of the wiring board, the mounted height of the wiring board can be reduced by a dimension corresponding to a depth of the recess.

Further, a lead frame according to the present invention has an engagement portion adapted to clip on one edge of the wiring board, a main fixing portion opposite to a flat surface of the wiring board, and an auxiliary fixing portion opposite to a side face of the wiring board, the latter two portions constituting such a lead section as in contact with the wiring board when the engagement portion is clipping on one edge of the wiring board. The main and auxiliary fixing portions are both secured to the wiring board with the engagement portion clipping on one edge of the wiring board.

In accordance with the above expedient, since the lead is secured to the wiring board at two locations, i.e., at both the main fixing portion and the auxiliary fixing portion, the connection area of the lead against the wiring board is increased to achieve enhancement of the connection strength of leads in the hybrid integrated circuit device. Also, since clipping of the lead frame on one edge of the wiring board serves to properly position both the main and auxiliary fixing portions when they are secured, the securing operation can be performed with good operability and high reproductivity.

These and other objects will become more fully apparent from the claims and from the description as it proceeds in connection with the drawings.

BRIEF DESCRIPTION OF THE DRAWINGS

FIG. 6 is a plan view showing the state in which leads are connected to a wiring board;

FIG. 7 is an end view in section of FIG. 6;

FIG. 8 is a schematic view showing another embodiment of the present invention;

FIG. 12 is an enlarged perspective view showing a lead fixing section of the hybrid integrated circuit device;

FIG. 13 is a plan view of a lead frame for use in assembling the hybrid integrated circuit device;

FIG. 14 is a side view showing the state in which a lead is connected to a wiring board; and FIG. 15 is a sectional view mainly showing a lead frame according to another embodiment of the present invention.

DESCRIPTION OF THE PREFERRED EMBODIMENTS (Embodiment 1)

One embodiment of the present invention will be described below with reference to the drawings.

Figure 1:
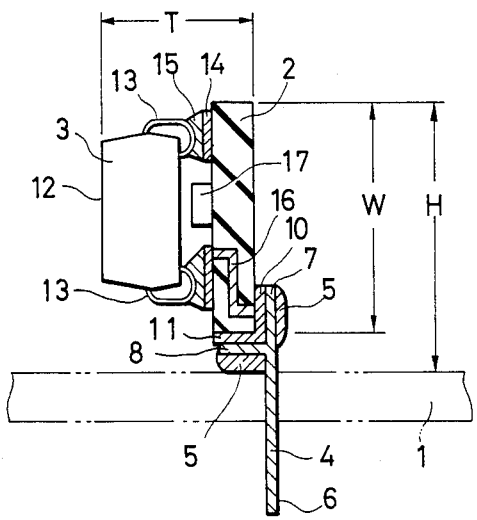
FIG. 1 is a schematic sectional view in elevation showing essential parts of a hybrid integrated circuit device according to one embodiment of the present invention.
Figure 2:
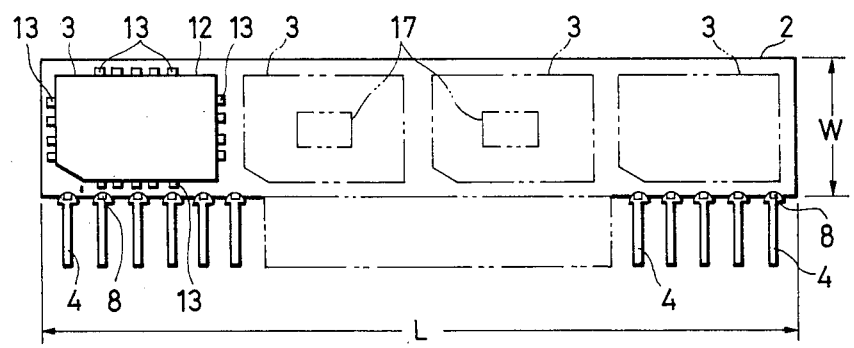
FIG. 2 is a plan view of the hybrid integrated circuit device.

The hybrid integrated circuit device according to one embodiment of the present invention has such a structure as shown in FIG. 1. In the figure, a single hybrid integrated circuit device is inserted through and mounted onto a mother board 1. In practice, however, a number of hybrid integrated circuit devices are inserted through the mother board 1 for mounting thereon. The hybrid integrated circuit device comprises a wiring board 2 formed of glass epoxy resin and having an electronic part 3 mounted on a flat primary surface (lefthand surface as viewed in the figure) of the wiring board, and a lead 4 fixed with a bonding material 5, such as solder, to an edge of the wiring board 2. The lead 4 is, as mentioned above, inserted through and mounted onto the mother board 1. The electronic part 3 is of a high capacity 256 Kbits dynamic RAM (Random Access Memory) by way of example and, as shown in FIG. 2, a quadruple of such parts are mounted on the wiring board 2 side by side. Further, two chip condensers 17 are mounted under two electronic parts 3 among them, respectively, so that the wiring board has a smaller length L and thickness T after mounting of the electronic parts thereon, to thereby achieve the high mounting mounting of wiring boards onto the mother board 1.

While chip condensers have been, in some cases, installed on the wiring board intermediate the four electronic parts 3, the above arrangement of the present invention can reduce in particular the length L of the wiring board 2, as compared with such prior art, by an extent corresponding to the installation area otherwise necessary for the chip condensers.

It is to be noted that a chip condenser is interposed between a source line and a ground line of the electronic part, and functions to prevent noise from being generated in signals transmitted over the source line.

The lead 4 consists of a straight lead body 6 which is inserted through the mother board 1, a main fixing portion 7, and an auxiliary fixing portion 8, the latter two portions being located at the distal end portion of the lead body 6.

More specifically, the distal end portion of the lead body 6 is trifurcated into a triple of branch leads to be cut away in the lengthwise direction of the lead, and the central branch lead (referred to also as auxiliary fixing portion) 8 is bent from the branched point at an angle of approximately 90° with respect to the remaining two branch leads (referred to also as main fixing portion) 7 on both sides.

The length of each branch lead from the branched point up to the distal end thereof is so selected that it is not larger than the thickness (side width) of the wiring board and any branch leads will not project beyond the side face of the wiring board when they are secured to the wiring board.

Figure 3:
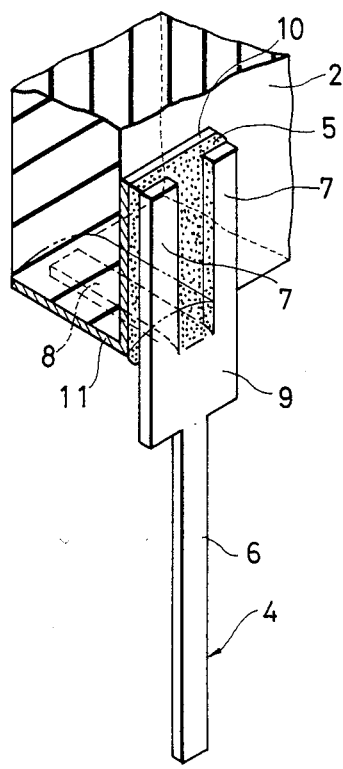
FIG. 3 is an enlarged perspective view showing a lead fixing section of the hybrid integrated circuit device.

As will be seen from FIG. 3, the auxiliary fixing portion 8 is formed by cutting halfway a wider rectangular part 9 than the lead body 6 from the distal end thereof into three pieces and then by bending the central piece at an angle of 90° relative to other two pieces. Accordingly, the main fixing portion 7 and the auxiliary fixing portion 8 are crossing with each other at an angle of 90°. The main fixing portion 7 is secured, with a solder 5 indicated at the dotted area in FIG. 3, to a lead attachment pad 10 of metallized layer formed at the edge of a flat surface (rear surface: righthand surface as viewed in the figure) of the wiring board 2 on which the electronic parts 3, etc. will not be mounted. Also, the auxiliary fixing portion 8 is secured with a solder 5 to a lead attachment pad 11 of metallized layer formed on the inner wall surface of a recess at the end face of the wiring board 2. The wiring board 2 is fabricated in such a manner that a wiring board material is cut out in the manufacture completion step along a linear line of through holes bored through the material. Because the cut width is smaller than a diameter of the through hole, a part of each through hole remains at one end face of the wiring board 2 thus fabricated, as a result cf which the lead attachment pad 11 is formed thereat. The auxiliary fixing portion 8 is secured to locate at the center of lead attachment pad 11, i.e., centrally at the bottom of a recess defined by the curved surface of the through hole. Incidentally, the electronic parts 3 are each mounted onto the wiring board 2 such that leads 13 projecting from the peripheral surface of a package 12 to extend toward the bottom side around the corner thereof, are placed on mount pads 14 of metallized layers formed on the primary surface of the wiring board 2, and then secured thereto with solder 15. In addition, the reference numeral 16 shown in FIG. 1 designates a conductor adapted to electrically connect between the two conductor layers (metallized layers) on the primary and rear surfaces of the wiring board.

In the hybrid integrated circuit device thus arranged, since the fixing section of the lead 4 is not connected to the primary surface of the wiring board 2, the wiring board 2 requires an area as small as necessary for mounting of the electronic parts 3 and hence the width W of the wiring board can be made narrower, whereby it becomes possible to reduce the inserted and mounted height H of the hybrid integrated circuit device with respect to the mother board 1. As a result, when the mother board 1 including the hybrid integrated circuit device of this embodiment inserted through and mounted onto the mother board is assembled in an electronic equipment, the electronic equipment can be reduced in its size.

On the other hand, since in the hybrid integrated circuit device of this embodiment the fixing section of the lead 4 against the wiring board 2 comprises the main fixing portion 7 secured to the flat surface of the wiring board 2 and the auxiliary fixing portion 8 secured to the end face of the wiring board 2, these fixing portions being disposed at two separate locations, the connection area between the wiring boar 2 and the lead 4 is increased and the connection strength therebetween is enhanced correspondingly. The enhanced connection strength also contributes to improve reliability of the hybrid integrated circuit device.

There will be described below a lead frame for use in manufacturing (assembling) the above-mentioned hybrid integrated circuit device, and a method of assembling the hybrid integrated circuit device by making use of the lead frame.

Figure 4:
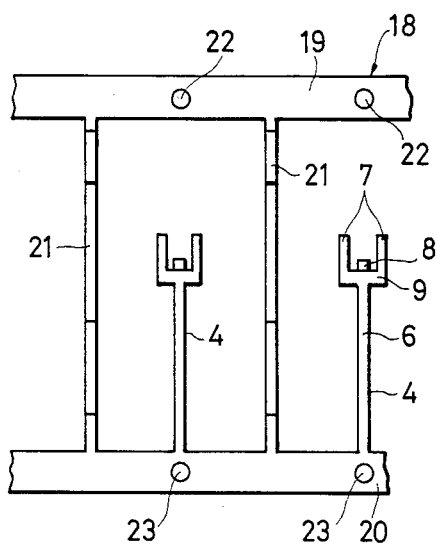
FIG. 4 is a plan view of a lead frame for use in assembling the hybrid integrated circuit device.
Figure 5:
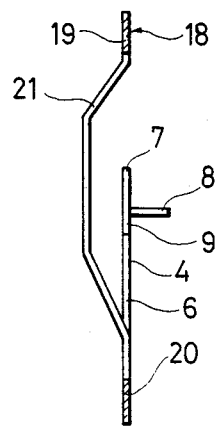
FIG. 5 is a sectional view of the lead frame.

A lead frame 18 is formed by stamping a thin metal sheet made of material such as an iron-nickel alloy, copper, or copper alloy, and has such a structure as shown in FIGS. 4 and 5. The lead frame 18 comprises a pair of thin frame pieces 19, 20 extending parallel with each other, a number of tie bars 21 arranged with constant spacings for tieing between the paired frame pieces 19 and 20, and a number of cantilevered leads 4 each arranged between the adjacent tie bars 21 and having one end fixed to one frame piece 20. As described above, each of the leads 4 is formed to have the main fixing portion 7 and the auxiliary fixing portion 8 in the rectangular part 19 of the lead body 18 at the distal end portion thereof. Further, the leads 4 are each positioned corresponding to the respective lead attachment pads 10, 11 of the wiring board 2. The tie bar 21 is so convexed as to bulge opposite to the direction in which the auxiliary fixing portion 8 of each lead 4 projects. This convexed portion serves to provide the tie bar 21 with resiliency, causing same to exhibit the spring action. Further, the frame pieces 19, 20 are formed with guide holes 22, 23, respectively. These guide holes 22, 23 are utilized in positioning the lead frame 18 at such times as when it is transferred.

When assembling the hybrid integrated circuit device using the above lead frame 18, as will be seen from FIGS. 6 and 7, the main fixing portion 7 and the auxiliary fixing portion 8 of each lead 4 are brought into contact with the lead attachment pads 10, 11 (not shown, but see FIG. 3) of the wiring board 2 mounting thereon the electronic parts 3, etc., respectively, and one frame piece 19 of the lead frame 18 contacting with another edge area of the wiring board 2 is temporarily secured by means of a clip 24 together with the wiring board 2. At this time, the spring action of the tie bars 21 causes the main fixing portion 7 and the auxiliary fixing portion 8 to resiliently contact with the wiring board 2, so that the main and auxiliary fixing portions 7, 8 are precisely and positively contacted with the respective lead attachment pads 10, 11 not shown in FIG. 7 in the face-to-face relation. Then, the solder material 5 is applied as shown in FIG. 1 to secure the main and auxiliary fixing portions 7, 8 onto the lead attachment pads 10, 11. After that, the clip 24 temporarily securing the lead frame 18 to the wiring board 2 is removed and the leads 4 are cut off at the root of the frame piece 20, as a result of which the hybrid integrated circuit device as shown in FIGS. 1 and 2 is manufactured. If the main fixing portion 7 is formed to have its contact surface with the wiring board 2 projecting relative to the plane coupling between the flat surfaces of the paired frame pieces 19 and 20 so that the main fixing portion 7 will contact with the wiring board 2 with stronger forces, the main fixing portion 7 would be flexed to provide the resilient contact when the main fixing portion 7 is contacted with the wiring board 2. Therefore, this improves reliability in securing of the main fixing portion 7 against the wiring board 2.

The above-mentioned embodiment results in the following effects.

(1) Since the leads are each secured to the wiring board with the main fixing portion secured to the flat surface of the wiring board and the auxiliary fixing portion secured to the end face of the wiring board, the hybrid integrated circuit device of the present invention has such an effect that the connection area is large and hence the connection strength is enhanced.

(2) Based on the above (1), the hybrid integrated circuit device of the present invention has such an effect that reliability is improved and stabilized with enhancement of the connection strength of the leads.

(3) Since the leads are secured to not the primary surface but the rear surface of the wiring board onto which primary surface are mounted the electronic parts, the hybrid integrated circuit device of the present invention has such an effect that the primary surface of the wiring board is not required to have a lead fixing area, which area can be instead utilized as a mounting area of the electronic parts, whereby the wiring board can be reduced in its area and hence its width to achieve the smaller size of the hybrid integrated circuit device.

(4) Based on the above (3), the hybrid integrated circuit device of the present invention has such an effect that the reduced width of the wiring board also contributes to lower the height of the wiring board with respect to the mother board when it is inserted through and mounted onto the mother board and, therefore, the size of the electronic equipment can be reduced which has the hybrid integrated circuit device incorporated therein using the mother board.

(5) Since the fixing section of each lead to be secured to the wiring board comprises two separate portions, i.e., the main fixing portion secured to the flat surface of the wiring board and the auxiliary fixing portion secured to the end face of the wiring board, the lead frame of the present invention has such an effect that the connection strength of the leads against the wiring board is enhanced.

(6) Since the lead frame of the present invention is so structured as to resiliently contact the fixing section of each lead with the wiring board when the lead is secured to the wiring board, there is obtained such an effect that the connection operation of the leads can be performed easily and positively.

(7) Based on the above (5) and (6), the present invention provides such an effect that the hybrid integrated circuit device having the leads of high connection strength can be manufactured with good reproducibility and, therefore, the manufacturing cost can be reduced with an improvement in yield.

(8) Based on the above (1) through (7), the present invention provides such a combined effect that it becomes possible to inexpensively manufacture the hybrid integrated circuit device having the lower mounted height with respect to the mother board and the high reliability.

While the invention accomplished by the present inventors has been specifically described with reference to one embodiment, it is a matter of course that the present invention is not limited to the foregoing embodiment and a variety of modifications can be made without departing from the scope of the invention. For example, as shown in FIG. 8, the connection strength of the leads can also be enhanced by a modified structure that the distal end portion of the lead 4 is bent into the stepped form with the stepped intermediate part serving as the auxiliary fixing portion 8 and the stepped distal end part serving as the main fixing portion 7.

While the invention accomplished by the present inventors has been described by mainly referring to application thereof to the manufacturing technique of the hybrid integrated circuit device which represents the background field in which the invention is to be utilized, the present invention will not be limited to such application.

The present invention is applicable to at least such technique used in connecting a bar-like or other similar members to a plate-like member.

The effects obtainable by typical features of the invention disclosed in this application will be briefly summarized as follows.

According to the hybrid integrated circuit device of the present invention, since the leads to be secured to the wiring board each comprise a main fixing portion secured to the wiring board opposite to the flat surface thereof on which no electronic parts are mounted, and an auxiliary fixing portion secured to the wiring board opposite to the side face thereof, each lead is connected to the wiring board at two locations and hence the connection area is enlarged, with the result that it becomes possible to achieve enhancement of the connection strength of the leads, i.e., an increase in reliability of the hybrid integrated circuit device.

(Embodiment 2)

Another embodiment of the present invention will be described below with reference to the drawings.

Figure 10:
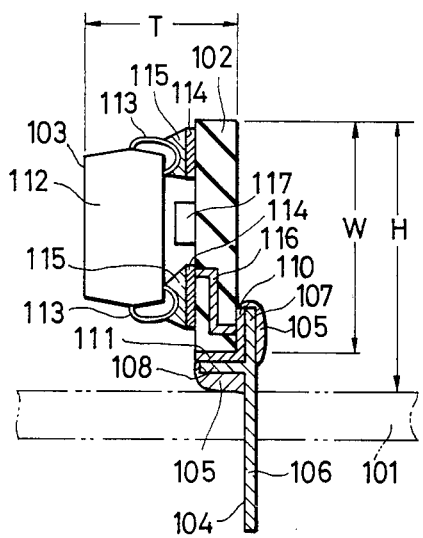
FIG. 10 is a schematic sectional view showing essential parts of the hybrid integrated circuit device.
Figure 11:
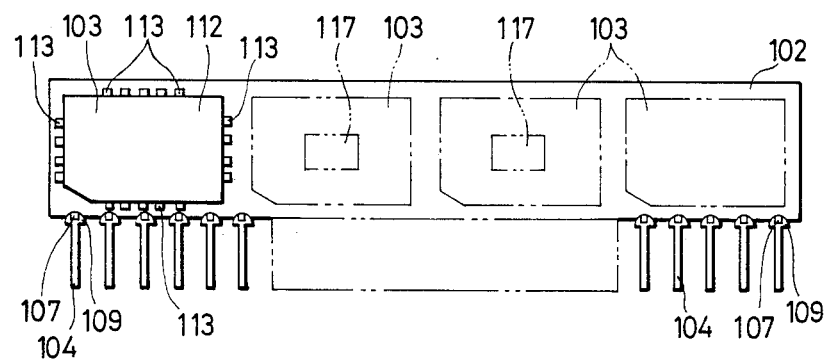
FIG. 11 is a plan view of the hybrid integrated circuit device.

The hybrid integrated circuit device manufactured in accordance with another embodiment of the present invention has such a structure as shown in FIG. 10. In the figure, a single hybrid integrated circuit device is inserted through and mounted onto a mother board 101. In practice, however, a number of hybrid integrated circuit devices are inserted through the mother board 1 for mounting thereon. The hybrid integrated circuit device comprises a wiring board 102 formed of glass epoxy resin and having an electronic part 103 mounted on a flat primary surface (lefthand surface as viewed in the figure) of the wiring board, and a lead 104 fixed with a solder (bonding material) 105 to an edge of the wiring board 102. The lead 104 is, as mentioned above, inserted through and mounted onto the mother board 101. The electronic part 3 is of a high capacity 256 Kbits dynamic RAM by way of example and, as shown in FIG. 11, a quadruple of such parts are mounted on the wiring board 102 side by side. Further, two chip condensers 117 are mounted under two electronic parts 103 among them, respectively, so that the wiring board has a smaller length L after mounting of the electronic parts thereon, to thereby achieve the high density mounting of wiring boards onto the mother board 101. While chip condensers 117 have been, in some cases, installed on the wiring board 102 intermediate the four electronic parts 103, the above arrangement of the present invention can reduce the length of the wiring board, as compared with such prior art, by an extent corresponding to the installation area otherwise necessary for the chip condensers 117.

The lead 104 consists of a straight lead body 106 which is inserted through the mother board 101, a main fixing portion 107, and an auxiliary fixing portion 108, the latter two portions being located at the distal end portion of the lead body 106. As will be seen from FIG. 12, the auxiliary fixing portion 108 is formed by cutting halfway a wider rectangular part 109 than the lead body 106 from the distal end thereof into three pieces and then by bending the central piece at an angle of 90° relative to other two pieces. Accordingly, the main fixing portion 107 and the auxiliary fixing portion 108 are crossing with each other at an angle of 90°. The main fixing portion 107 is secured, with a solder 105 indicated at the dotted area in FIG. 12, to a lead attachment pad (fixing point) 110 of metallized layer formed at the edge of a flat surface (rear surface: righthand surface as viewed in the figure) of the wiring board 102 on which the electronic parts 103, etc. will not be mounted. Also, the auxiliary fixing portion 108 is secured with a solder 105 to a lead attachment pad (fixing point) 111 of metallized layer formed on the inner wall surface of a recess at the end face of the wiring board 102. The wiring board 102 is fabricated in such a manner that a wiring board material is cut out in the manufacture completion step along a linear line of through holes bored through the material. Because the cut width is smaller than a diameter of the through hole, a part of each through hole remains at one end face of the wiring board 102 thus fabricated, as a result of which the lead attachment pad 111 is formed thereat. The auxiliary fixing portion 108 is secured to locate at the center of the lead attachment pad 111, i.e., centrally at the bottom of a recess defined by the curved surface of the through hole. Incidentally, the electronic parts 103 are each mounted onto the wiring board 102 such that leads 113 projecting from the peripheral surface of a package 112 to extend toward the bottom side around the corner thereof, are placed on mount pads 114 of metallized layers formed on the primary surface of the wiring board 102, and then secured thereto with solder material 115. In addition, the reference numeral 116 shown in FIG. 10 designates a conductor adapted to electrically connect between the two conductor layers (metallized layers) on the primary and rear surfaces of the wiring board 102.

In the hybrid integrated circuit device thus arranged, since the fixing section of the lead 104 is not connected to the primary surface of the wiring board 102, the wiring board 102 requires an area as small as necessary for mounting of the electronic parts 3 and hence the width W of the wiring board can be made narrower, whereby it becomes possible to reduce the inserted and mounted height H of the hybrid integrated circuit device with respect to the mother board 101. As a result, when the mother board 101 including the hybrid integrated circuit device of this embodiment inserted through and mounted onto the mother board is assembled in an electronic equipment, the electronic equipment can be reduced in its size.

On the other hand, since in the hybrid integrated circuit device of this embodiment the fixing section of the lead 104 against the wiring board 102 comprises the main fixing portion 107 secured to the flat surface of the wiring board 102 and the auxiliary fixing portion 108 secured to the end face of the wiring board 102, these fixing portion being disposed at two separate locations, the connection area is increased and the connection strength is enhanced correspondingly. The enhanced connection strength also contributes to improve reliability of the hybrid integrated circuit device.

There will be described below a lead frame for use in manufacturing (assembling) the above-mentioned hybrid integrated circuit device, and a method of assembling the hybrid integrated circuit device by making use of the lead frame.

A lead frame 118 is formed by stamping a thin metal sheet made of material such as an iron-nickel alloy, copper, or copper alloy, and has such a structure as shown in FIGS. 13 and 14. The lead frame 118 has an elongate frame piece 119, and an engaging frame piece 120 a part of which is extending parallel with the frame piece 119. The lead frame 118 also has a number thin bars 121 adapted to tie between the frame piece 119 and the engaging frame piece 120. The tie bars 121 are extending in the direction perpendicular to the frame piece 119 and arranged with constant spacings therebetween. Between the adjacent tie bars 121, there are arranged cantilevered leads 104 each having one end fixed to the frame piece 119. As described above, each of the leads 104 is formed to have the main fixing portion 107 and the auxiliary fixing portion 108 in the rectangular part 119 of the lead body 106 at the distal end portion thereof. Further, the leads 104 are each positioned corresponding to the respective lead attachment pads 110, 111 of the wiring board 102.

Figure 9:
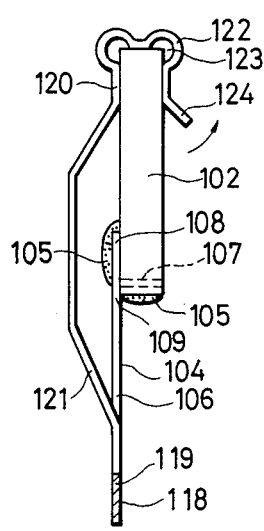
FIG. 9 is a schematic view showing a method of manufacturing a hybrid integrated circuit device according to one embodiment of the present invention.

As shown in FIGS. 9 and 14, the engaging frame piece 120 has a cross section bent into the substantially U form so as to provide a clip (engagement portion) 122 capable of clipping on one edge of the wiring board 102. When applying the clip 122 of the engaging frame piece 120 to the wiring board 102 for clipping, one edge of the wiring board 102 on the side where the leads 104 are not to be secured is inserted into a U-shaped recessed open space 123 of the clip 122 until the edge strikes against the bottom of the clip 122. This insertion allows the wiring board 102 to be automatically positioned in the direction of insertion thereof. Also, positioning of the wiring board 102 in the lengthwise direction thereof is selectively made when clipping one edge of the wiring board to the lead frame 118. To the contrary, the wiring board 102 can easily removed from the clip 122 by lifting up an open end 124 of the clip 122 as indicated by an arrow and then withdrawing the wiring board 102 therefrom. When the wiring board 102 is brought into a positioned state where it is clipped by and attached to the clip 122, as described above, the main fixing portion 107 of the lead 104 comes into contact with the lead attachment pad 110 provided on the flat surface of the wiring board 102 on which the electronic parts 102, etc. will not be mounted, and the auxiliary fixing portion 108 thereof comes into contact with the lead attachment pad 111 provided on the side face of the wiring board 102, as shown in FIG. 12.

Moreover, the tie bars 121 are each so convexed as to buldge opposite to the direction in which the auxiliary fixing portion 108 of the lead 104 is projecting. This convexed portion serves to provide the tie bar 121 with resiliency, causing same to exhibit the spring action. Further, the frame piece 119 and the engaging frame piece 120 are formed with guide holes 125, 126, respectively.

When assembling the hybrid integrated circuit device using the above lead frame 118, as will be seen from FIGS. 9, 13 and 14, the main fixing portion 107 and the auxiliary fixing portion 108 of each lead 104 are positioned to come into contact with the lead attachment pads 110, 111 (not shown) of the wiring board 102 mounting thereon the electronic parts 103, etc., respectively. After that, one end of the wiring board 102 is inserted into the clip 122 of the lead frame 118 to thereby temporarily secure the wiring board 102 relative to the lead frame 118. As a result, the main fixing portion 107 and the auxiliary fixing portion 108 of the lead 104 are fixedly positioned opposite to the lead attachment pads 110, 111, respectively. At this time, the spring action of the tie bars 121 causes the main fixing portion 107 and the auxiliary fixing portion 108 to resiliently contact with the wiring board 102, so that the main and auxiliary fixing portions 107, 108 are precisely and positively contacted with the respective lead attachment pads 110, 111 (not shown in FIG. 14) in the face-to-face relation. Then, the solder material 105 is applied to secure the main and auxiliary fixing portions 107, 108 onto the lead attachment pads 110, 111. Thereafter, the leads 104 are cut off at the root of the frame piece 119. After cutting of the leads 104, the clip 122 temporarily clamping the wiring board 102 is removed away. As a consequence, the hybrid integrated circuit device is as shown in FIGS. 10 and 11. Incidentally, if the main fixing portion 107 is formed to have its contact surface with the wiring board 102 projecting relative to the plane coupling between the flat surfaces of the frame piece 119 and the engaging frame piece 120 so that the main fixing portion 107 will contact with the wiring board 102 with stronger forces, it would be possible to improve reliability in securing of the main fixing portion 107 against the wiring board 102.

This embodiment results in the following effects.

(1) Since the leads are each secured to the wiring board with the main fixing portion secured to the flat surface of the wiring board and the auxiliary fixing portion secured to the end face of the wiring board, the hybrid integrated circuit device manufactured in accordance with the present invention has such an effect that the connection area is large and hence the connection strength is enhanced.

(2) Based on the above (1), the hybrid integrated circuit device manufactured in accordance with the present invention has such an effect that reliability is stabilized with enhancement of the connection strength of the leads.

(3) Since the leads are secured to not the primary surface but the rear surface of the wiring board onto which primary surface are mounted the electronic parts, the hybrid integrated circuit device manufactured in accordance with the present invention has such an effect that the primary surface of the wiring board is not required to have a lead fixing area, which area can be instead utilized as a mounting area of the electronic parts, whereby wiring board can be reduced in its area and hence its width to achieve the smaller size of the hybrid integrated circuit device.

(4) Based on the above (3), the hybrid integrated circuit device manufactured in accordance with the present invention has such an effect that the reduced width of the wiring board also contributes to lower the height of the wiring board with respect to the mother board when it is inserted through and mounted onto the mother board and, therefore, the size of the electronic equipment can be reduced which has the hybrid integrated circuit device incorporated therein using the mother board.

(5) Since the fixing section of each lead to be secured to the wiring board comprises two separate portions, i.e., the main fixing portion secured to the flat surface of the wiring board and the auxiliary fixing portion secured to the end face of the wiring board, the lead frame of the present invention has such an effect that the connection strength of the leads against the wiring board is enhanced.

(6) Since the engagement portion previously provided on the lead frame can be applied to clip on one edge of the wiring board for temporary securing of the lead frame when placing the leads to contact the main and auxiliary fixing portions thereof with the wiring board, the lead frame of the present invention has such an effect that the leads can be secured to the wiring board with good accuracy to achieve an improvement in reproducibility as well as yield.

(7) Based on the above (6), since the operation of placing the leads to contact the main and auxiliary fixing portions thereof with the wiring board is performed by making use of the engagement portion of a clip structure previously provided on the lead frame, the lead frame of the present invention has such an effect that the operability is improved.

(8) Since the lead frame of the present invention is so structured as to resiliently contact the fixing section of each lead with the wiring board when the lead is secured to the wiring board, there is obtained such an effect that the connection operation of the leads can be performed easily and positively.

(9) Based on the above (6) through (8), the method of manufacturing the hybrid integrated circuit device of the present invention provides such an effect that the hybrid integrated circuit device having the leads of high connection strength can be manufactured with good operability and high reproducibility, and, therefore, the manufacturing cost can be reduced with an improvement in yield.

(10) Based on above (1) through (9), the present invention provides such a combined effect that it becomes possible to inexpensively manufacture the hybrid integrated circuit device having the lower mounted height with respect to the mother board and the high reliability.

While the invention accomplished by the present inventors has been specifically described with reference to another embodiment, it is a matter of course that the present invention is not limited to the foregoing embodiment and a variety of modifications can be made without departing from the scope of the invention. For example, as shown in FIG. 15, the connection strength of the leads can also be enhanced by a modified structure that the distal end portion of the lead 104 is bent into the stepped form with the stepped intermediate part serving as the auxiliary fixing portion 108 and the stepped distal end part serving as the main fixing portion 107.

While the invention accomplished by the present inventors has been described by mainly referring to application thereof to the manufacturing technique of the hybrid integrated circuit device which represents the background field in which the invention is to be utilized, the present invention will not be limited to such application.

The present invention is applicable to at least such technique used in connecting a bar-like or other similar members to a plate-like member.

The effects obtainable by typical features of the invention disclosed in this application will be briefly summarized as follows.

According to the present invention adapted to manufacture the hybrid integrated circuit device of a structure of fixing leads to one edge of a wiring board, since the lead frame comprises an engagement portion capable of clipping on one edge of the wiring board, and lead sections each including a main fixing portion opposite to the flat surface of the wiring board and a auxiliary fixing portion opposite to the side face of the wiring board, these fixing portions being contacted with the wiring board when the engagement portion is clipping on one edge of the wiring board, and the main fixing portion and the auxiliary fixing portion are secured with solders to the wiring board with the engagement portion being placed to clip on one edge of the wiring board, the fixing operation of the leads can be performed with good operability and high reproducibility, and the leads are each secured to the wiring board at two separate locations, i.e., at the main fixing portion and the auxiliary fixing portion, with the result that the connection strength of the leads against the wiring board is enhanced to achieve an improvement in reliability of the hybrid integrated circuit device.

What is claimed is:

1. In a hybrid integrated circuit device comprising:
a plurality of electronic parts;
a wiring board having primary front and rear surfaces on opposite faces thereof and a side edge surface that extends between said faces with means mounting said plurality of electronic parts on the primary front surface thereof; and
a plurality of leads secured to the edge of said wiring board,
the improvement in that a fixing section of each of said leads has a main fixing portion secured to the primary rear surface of said wiring board, and an auxiliary fixing portion secured to the side edge surface of said wiring board with no fixing portion secured to said primary front surface, the auxiliary fixing portion of said lead being branched from the main fixing portion thereof such that the branched auxiliary fixing portion is bent at an angle of approximately 90° with respect to the main fixing portion.

2. In a hybrid integrated circuit device comprising:
a plurality of electronic parts;
a wiring board having primary front and rear surfaces on opposite faces thereof and a side edge surface that extends between said faces with means mounting said plurality of electronic parts on the primary front surface thereof; and
a plurality of leads secured to the edge of said wiring board,
the improvement in that a fixing section of each of said leads has a main fixing portion secured to the primary rear surface of said wiring board, and an auxiliary fixing portion secured to the side edge surface of said wiring board, the auxiliary fixing portion of said lead being branched from the main fixing portion thereof such that the branched auxiliary fixing portion is bent at an angle of approximately 90° with respect to the main fixing portion, the side edge surface of said wiring board to which is secured the auxiliary fixing portion of each said lead has a recess, and the auxiliary fixing portion of each said lead is centrally positioned at the bottom of said recess when secured to said wiring board.

3. A hybrid integrated circuit device according to claim 2, wherein said plurality of electronic parts include four semiconductor memories.

4. In a hybrid integrated circuit device comprising:
a plurality of electronic parts;
a wiring board mounting said plurality of electronic parts on the primary front surface thereof; and
a plurality of leads secured to the edge of said wiring board,
the improvement in that the distal end portion of each of said leads as a fixing section against said wiring board is trifurcated into three branch leads to be cut away in the lengthwise direction of said lead, the central branch lead being bent from the branched point at an angle of approximately 90° with respect to the remaining two branch leads on both sides.

5. A hybrid integrated circuit device according to claim 4, wherein the side face of said wiring board to which is secured the central branch lead of each said lead has a recess, and the central branch lead of each said lead is centrally positioned at the bottom of said recess for securing thereof to said wiring board.

6. A hybrid integrated circuit device according to claim 4, wherein said plurality of electronic parts include four semiconductor memories.

7. In a hybrid integrated circuit device comprising:
a plurality of electronic parts;
a wiring board mounting said plurality of electronic parts on the primary front surface thereof; and
a plurality of leads secured to the edge of said wiring board,
the improvement in that the distal end portion of each of said leads as a fixing section against said wiring board is trifurcated into three branch leads to be cut away in the lengthwise direction of said lead, the central branch lead being bent from the branched point at an angle of approximately 90° with respect to the remaining two branch leads on both sides, and the length of each of said branch leads from the branched point up to the distal end of each said branch lead is selected to be less than the thickness of said wiring board, i.e., the widthwise dimension of the side face thereof.

8. A hybrid integrated circuit device according to claim 7, wherein the side face of said wiring board to which is secured the central branch lead of each said lead has a recess, and the central branch lead of each said lead is centrally positioned at the bottom of said recess for securing thereof to said wiring board 9. In a hybrid integrated circuit device of a type wherein a plurality of leads are secured to an edge of a wiring board which has a front surface with at least one electronic part mounted thereon, the improvement in that each of said leads has a main fixing portion on a rear surface opposite to said front surface of said wiring board and an auxiliary fixing portion opposite to a side face of said wiring board that is in a plane perpendicular to the front surface, said main fixing portion and said auxiliary fixing portion being secured to said wiring board with bonding materials that do not engage said front surface.

10. A hybrid integrated circuit device of a type wherein a plurality of leads are secured to an edge of a wiring board mounting thereon at least one electronic part, the improvement in that each of said leads has a main fixing portion opposite to a flat surface of said wiring board and an auxiliary fixing portion opposite to a side face of said wiring board that is in a plane perpendicular to the flat surface, said main fixing portion and said auxiliary fixing portion being secured to said wiring board with bonding materials and wherein the side face of said wiring board to which is secured the auxiliary fixing portion of each said lead has a recess, and said auxiliary fixing portion is centrally positioned at the bottom of said recess.

11. A method of manufacturing a hybrid integrated circuit device of type that a plurality of leads are secured to one edge of a wiring board mounting thereon at least one electronic part, said method comprising the steps of; preparing a lead frame which has an engagement portion to be contacted with another edge of said wiring board, a main fixing portion provided on each of said leads to be opposite to the flat surface of said wiring board, and an auxiliary fixing portion provided on each of said leads to be opposite to the side face of said wiring board; attaching the engagement portion of said lead frame to another edge of said wiring board by means of a clip so that the main fixing portion and the auxiliary fixing portion of each said lead come into contact with said wiring board; securing the main fixing portion and auxiliary fixing portion of each said lead to said wiring board with bonding materials; and removing the useless part of said lead frame.

12. A method of manufacturing a hybrid integrated circuit device according to claim 11, wherein the main fixing portion of each said lead is secured to the surface of said wiring board on which no electronic part will be mounted 13. In a wiring plate comprising:
a wiring board capable of mounting thereon at least one electronic part and including a wiring network adapted to form a predetermined electric circuit in cooperation with said electronic part; and
a plurality of leads secured to an edge of said wiring board,
a improvement in that the distal end portion of each of said leads serves a fixing section against said wiring board and is trifurcated into three branch leads to be cut away in the lengthwise direction of said lead, the central branch lead being bent from the branched point at an angle of approximately 90° with respect to the remaining two branch leads on both sides.

14. A wiring plate according to claim 13, wherein the side face of said wiring board to which is secured the central branch lead of each said lead has a recess, and the central branch lead of each said lead is centrally positioned at the bottom of said recess for securing thereof to said wiring board.

15. In a wiring plate comprising:
a wiring board capable of mounting thereon at least one electronic part and including a wiring network adapted to form a predetermined electric circuit in cooperation with said electronic part; and
a plurality of leads secured to the edge of said wiring board,
the improvement in that the distal end portion of each of said leads serves as a fixing section against said wiring board and is trifurcated into three branch leads to be cut away in the lengthwise direction of said lead, the central branch lead being bent from the branched point at an angle of approximately 90° with respect to the remaining two branch leads on both sides, and the length of each of said branch leads from the branched point up to the distal end of each said branch lead is selected to be less than the thickness of said wiring board, i.e., the widthwise dimension of a side face thereof.

16. A wiring plate according to claim 15, wherein the side face of said wiring board to which is secured the central branch lead of each said lead has a recess, and the central branch lead of each said lead is centrally positioned at the bottom of said recess for securing thereof to said wiring board.

17. In a lead frame for use in manufacturing a hybrid integrated circuit device, said lead frame having an upper frame member and a lower frame member, a plurality of leads attached to said lower member, means for securing said plurality of leads to an edge of a wiring board that is adapted to be positioned between said upper and lower members and to have at least one electronic part mounted thereon, the improvement in that each of said leads has, as fixing pieces secured to said wiring board, a main fixing portion opposite to a flat surface of said wiring board and an auxiliary fixing portion opposite to a side face of said wiring board that is perpendicular to said flat surface.

18. In a lead frame for use in manufacturing a hybrid integrated circuit device, said lead frame having a lower frame member for positioning a plurality of leads to be secured to one edge of a wiring board mounting thereon at least one electronic part, the improvement in that said lead frame has an upper engagement portion that is spaced from said lower frame member and adapted to be contacted with another edge of said wiring board, a main fixing portion provided on each of said leads to be opposite to a flat surface of said wiring board, and an auxiliary fixing portion provided on each of said leads to be opposite to a side face of said wiring board that is perpendicular to said flat surface, the main fixing portion and the auxiliary fixing portion of each of said leads being arranged to come into contact with said wiring board at respective fixing locations when said engagement portion is in contact with said wiring board.

19. In a lead frame having a plurality of leads to be secured to the edge of a wiring board, the improvement in that said lead frame comprises a pair of two frame members spaced parallel to each other with a predetermined spacing therebetween, a plurality of tie bars for coupling said two parallel frame members, and a plurality of leads extending from one of said frame members and spaced from each other with constant spacings, and the distal end portion of each of said leads is trifurcated into three branch leads to be cut away in the lengthwise direction of said lead, the central branch lead being bent from the branched point at an angle of approximately 90° with respect to the remaining two branch leads on both sides.

20. A lead frame according to claim 19, wherein a single tie bar is interposed between each pair of said adjacent leads.

21. In a lead frame having a plurality of leads to be secured to the edge of a wiring board, the improvement in that said lead frame comprises an engagement portion to be contacted with one edge of said wiring board and a plurality of leads to be secured to another edge of said wiring board, the distal end portion of each of said leads is trifurcated into three branch leads to be cut away in the lengthwise direction of said lead, the central branch lead being bent from the branched point at an angle of approximately 90° with respect to the remaining two branch leads on both sides, and the length of each said branch lead is selected to be less than the thickness of said wiring board, i.e., the widthwise direction of the side face thereof.

22. In a hybrid integrated circuit device comprising:
a plurality of electronic parts;
a wiring board having primary front and rear surfaces on opposite faces thereof and a side edge surface that extends between said faces with means mounting said plurality of electronic parts on the primary front surface thereof; and
a plurality of leads secured to the edge of said wiring board,
the improvement in that a fixing section of each of said leads has a main fixing portion secured to the primary rear surface of said wiring board, and an auxiliary fixing portion secured to the side edge surface of said wiring board, the auxiliary fixing portion of said lead being branched from the main fixing portion thereof such that the branched auxiliary fixing portion is bent at an angle of approximately 90° with respect to the main fixing portion, and wherein said auxiliary fixing portion is secured to the side edge surface of the wiring board by solder and no part of the leads extends to the primary front surface.

* * * * *